US012066875B2

(12) United States Patent
Kartadinata et al.

(10) Patent No.: US 12,066,875 B2
(45) Date of Patent: Aug. 20, 2024

(54) CABLE BRACKET FOR STACKED HBAS WITH BRACKET-MOUNTED CONNECTORS

(71) Applicant: Hewlett Packard Enterprise Development LP, Houston, TX (US)

(72) Inventors: Warren A. Kartadinata, Fremont, CA (US); Vance B. Murakami, Los Gatos, CA (US); Neil Jefferson Asmussen, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/751,373

(22) Filed: May 23, 2022

(65) Prior Publication Data

US 2023/0376084 A1    Nov. 23, 2023

(51) Int. Cl.
  *G06F 1/18* (2006.01)
  *H05K 5/02* (2006.01)
  *H05K 7/18* (2006.01)
(52) U.S. Cl.
  CPC ........... *G06F 1/183* (2013.01); *H05K 5/0286* (2013.01); *H05K 7/183* (2013.01)

(58) Field of Classification Search
  CPC ....................................................... H05K 5/00
  See application file for complete search history.

(56) References Cited

U.S. PATENT DOCUMENTS

| 2014/0126142 A1* | 5/2014 | Dean | G06F 1/181 |
| | | | 361/679.54 |
| 2014/0132139 A1* | 5/2014 | Chang | H05K 7/183 |
| | | | 312/333 |
| 2018/0242478 A1* | 8/2018 | Cui | H01R 3/08 |

* cited by examiner

*Primary Examiner* — Jerry Wu
(74) *Attorney, Agent, or Firm* — Yao Legal Services, Inc.

(57) ABSTRACT

In one aspect, a bracket assembly comprises a bracket and a pair of rails. The bracket comprises a first portion which includes a first segment with a first opening and a second segment with a second opening. The pair of rails comprises: a first rail which includes a first tab protruding from the first rail and including a first notch; and a second rail which includes a second tab protruding from the second rail and including a second notch. The bracket is to attach to the pair of rails when: the first portion is placed against the ends of the rails such that the first tab is inserted into the first opening and the second tab is inserted into the second opening; and the bracket is slid down such that the first opening rests in the first notch and the second opening rests in the second notch.

20 Claims, 10 Drawing Sheets

CABLE BRACKET FOR STACKED HBAS WITH BRACKET-MOUNTED CONNECTORS

BACKGROUND

Field

In the computing arts, a two rack unit (2 U) enclosure may require two one rack unit (1 U) input/output modules (IOMs). The nominal height for the chassis of a 1 U may be listed as 44.45 millimeters (mm). The 1 U IOM may have an external dimension height of 41 mm. Due to the thickness of the sheet metal material as well as spacing requirements, the 1 U IOM may have an internal dimension height closer to 38.7 mm. In a system which requires four Open Compute Project (OCP) host bus adapters (HBAs) (with a height of 11.5 mm) per 1 U IOM, additional space may be required for functionally critical features (such as ejector handles, HBA guide structures, and other ports). These additional space considerations can result in stacking two HBAs in order to fit all four HBAs in the faceplate of the 1 U IOM. Such a stacked HBA and IOM layout may require certain cabled connections between the motherboard and the HBAs, which can create issues relating to air flow and cable management and assembly.

BRIEF DESCRIPTION OF THE FIGURES

In the figures, like reference numerals refer to the same figure elements.

DETAILED DESCRIPTION

Figure 1A:
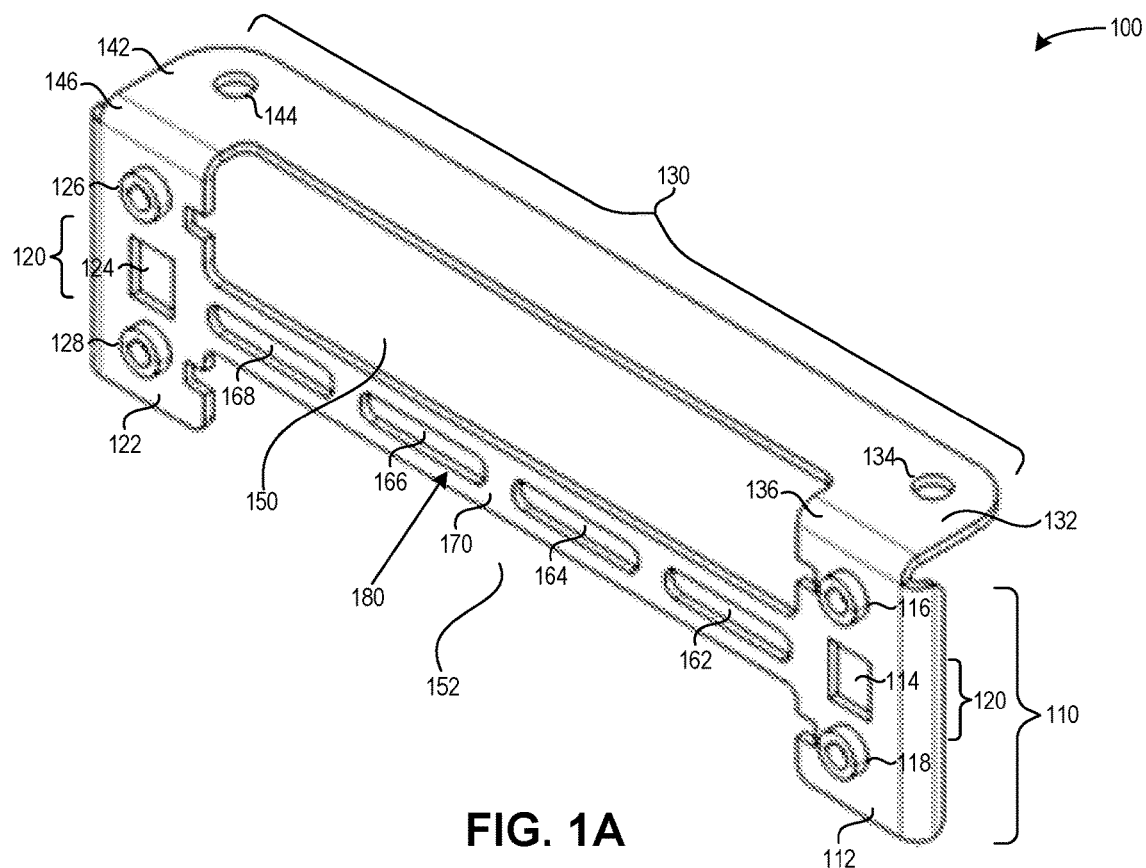
FIG. 1A illustrates a bracket, from a rear isometric view, in accordance with an aspect of the present application.

The following description is presented to enable any person skilled in the art to make and use the aspects and examples, and is provided in the context of a particular application and its requirements. Various modifications to the disclosed aspects will be readily apparent to those skilled in the art, and the general principles defined herein may be applied to other aspects and applications without departing from the spirit and scope of the present disclosure. Thus, the aspects described herein are not limited to the aspects shown, but are to be accorded the widest scope consistent with the principles and features disclosed herein.

As described above, current form factor requirements for 1 U IOMs and HBAs may require stacking of HBAs in order to solve the technical problem of fitting stacked OCP HBAs within a 2 U form factor enclosure. For example, based on the above-described dimensions, a system which requires four OCP HBAs per 1 U IOM may require stacking two pairs of HBAs in order to fit all four HBAs in the form factor of a 1 U IOM. The layout of the stacked HBAs within a 1 U IOM may require certain cabled connections between the motherboard and the HBAs. The cables used in such connections may affect or impede the airflow to the HBAs, and the location and tolerance of connectors to the HBAs may be essential in ensuring a reliable interface between the HBAs and the connectors.

The disclosed aspects provide a system for facilitating both a reliable interface between the HBAs and the connectors and ensuring airflow through the HBAs. The system can include a bracket assembly with a bracket and a pair of rails, which allows two HBAs to be inserted in a stacked format by using the same reference plane to mount the bracket to the pair of rails. The bracket can include features (such as openings) which can align with elements (such as tabs and notches) on the rails to improve the ease of connecting the bracket with the rails. The bracket can be a cable bracket and the rails can be guide rails for insertion of the HBAs. The bracket can mount or be connected to sets of assembled cables via connector elements (as described below in relation to FIGS. 2A-2E), and can also affix to the rails by placing, inserting, and sliding movements (as described below in relation to FIGS. 3, 4A, and 4B).

The bracket can include a first portion and a second portion, as described below in relation to FIGS. 1A and 1B. The bracket can include cable connector openings in the first portion through which cable assemblies may be inserted, as described below in relation to FIGS. 2A-2E. The bracket can also include openings on each side or segment of the first portion. The rails can include assembly alignment features, including tabs and notches which are at the ends of the rails. The tabs and notches can be positioned or placed in alignment with the openings on each side or segment of the first portion of the bracket, as described below in relation to FIGS. 3, 4A, and 4B. Furthermore, the rails can include posts with connector receivers (such as threaded holes) indented on top of the posts, which can allow connecting components (such as screws) to attach the bracket to the rails from the second portion of the bracket, as described below in relation to FIGS. 3, 4A, and 4B.

In the described aspects, the bracket can be placed against the tabs on the ends of the rails and slid down to rest in notches behind the tabs. The openings on the bracket and the tabs on the rails can be aligned such that the movement of placing and sliding the bracket down can result in locking the bracket in a fixed position with the rails, as described below in relation to FIGS. 3, 4A, and 4B. In another aspect, a bracket can include a tray (such as a cable tray) protruding from one side of the bracket, where the tray can provide support to a set of assembled cables, as described below in relation to FIGS. 5A-5C. The tray can protrude from a back side of the bracket and can ensure that the supported set of assembled cables do not obstruct the path of the flow of air over the components in or associated with the bracket assembly, including the HBAs.

In a further aspect, the bracket or bracket assembly can reside in or be placed or installed in a chassis into which multiple HBAs can be inserted. The side of the chassis into which the HBAs are inserted can be referred to as the "front" of the chassis, while the opposite side of the front side can be referred to as the "back" of the chassis. Thus, the "front" side of all components inside the chassis can be viewed as the side closest to or facing the front of the chassis, while the "rear" or "back" side of all components inside the chassis can be viewed as the side closest to or facing the back of the chassis (i.e., facing away from the front of the chassis). The term "rear isometric view" can refer to a perspective taken from the rear of the chassis or component, while the term "front isometric view" can refer to a perspective taken from the front of the chassis or component. A component in this disclosure can include, but is not limited to: a bracket, including its various portions, segments, areas, regions, and parts; a set of cables; a rail; and an HBA.

The terms "cable set," "cable assembly," "cable assembly set," "assembled cables", "set of cables, and "set of assembled cables" are used interchangeably in this disclosure and refer to a set of cables which may include multiple cables enclosed in various coverings and attached to connector openings on one end.

The terms "mount," "attach," "affix," and "place" are used interchangeably in this disclosure and refer to placing two components next to each other so that they are touching in at least one area. The terms "fixed" and "locked" refer to two components which are not only touching each other but which require a movement (such as unscrewing a connecting component or sliding one component in a particular direction) in order for the two components to be separated from each other and not touching each other in any area.

The terms "rail" and "guide rail" are used interchangeably in this disclosure and refer to a flat bar or series of bars which are used to guide a component such as an HBA into a position which allows the HBA to properly attach to a set of cables.

FIG. 1A illustrates a bracket 100, from a rear isometric view, in accordance with an aspect of the present application. In FIG. 1A, bracket 100 is viewed from a back side 180 of bracket 100. Bracket 100 can include a first portion 110 (e.g., a flat piece which can be placed or positioned vertically within a chassis), which includes: a first segment 112 with a first opening 114; a second segment 122 with a second opening 124; and a third segment 170. First segment 112 can also include a first cable connector opening 116 and a second cable connector opening 118 which are positioned or arranged in opposite directions from first opening 114 (e.g., above and below first opening 114 when first portion 110 is positioned in a vertical position in relation to the ground). Similarly, second segment 122 can include a third cable connector opening 126 and a fourth cable connector opening 128 which are positioned or arranged in opposite directions from second opening 124 (e.g., above and below second opening 124 when first portion 110 is positioned in a vertical position in relation to the ground).

Bracket 100 can also include a third opening 150 into which a first set of cables is or can be inserted and a fourth opening 152 into which a second set of cables is or can be inserted. The term "opening" generally refers to a space, area, or gap, and may or may not be surrounded or defined by a contiguous border. For example, third opening 150 is surrounded by a contiguous border, while fourth opening 152 is not surrounded by a contiguous border. An object may be inserted or placed through an opening.

Second portion 130 can be connected to first portion 110 at a perpendicular angle: at a first area 136 which abuts first segment 112 of first portion 110 and a fourth segment 132 of second portion 130; and at a second area 146 which abuts second segment 122 of first portion 110 and a fifth segment 142 of second portion 130.

First portion 110 can further include a middle region 120. First opening 114, second opening 124, and third segment 170 can reside or be located in middle region 120 of first portion 110. Third segment 170 can include a plurality of openings 162, 164, 166, and 168. While openings 162-168 in FIG. 1A are depicted as rectangular with rounded corners or curved sides, openings 162-168 can be any shape, including rectangular, oval, square, or any concave or convex polygonal shape with straight or curved lines. Third segment 170 can be located in middle region 120 of first portion 110. Third segment 170 can abut first segment 112, second segment 122, third opening 150, and fourth opening 152 of first portion 110.

The rear isometric view of bracket 100 in FIG. 1A can represent an angled view from an upper back part of a chassis in which the bracket resides or is installed, where the front of the chassis corresponds to where HBAs are to be inserted (as depicted below in relation to FIG. 4B).

Figure 1B:
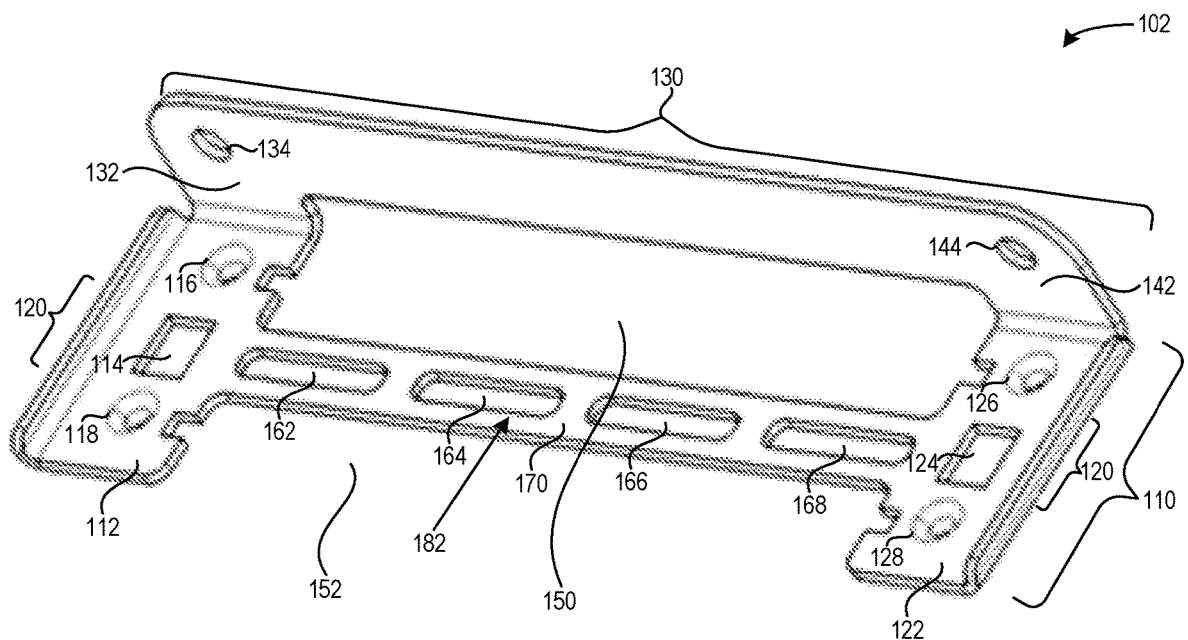
FIG. 1B illustrates a bracket corresponding to the bracket of FIG. 1A, from a front isometric view, in accordance with an aspect of the present application.

FIG. 1B illustrates a bracket 102 corresponding to bracket 100 of FIG. 1A, from a front isometric view, in accordance with an aspect of the present application. In FIG. 1B, bracket 102 is viewed from a front side 182 of bracket 102, specifically, at an angled view from a lower front part of bracket 102.

Figure 2A:
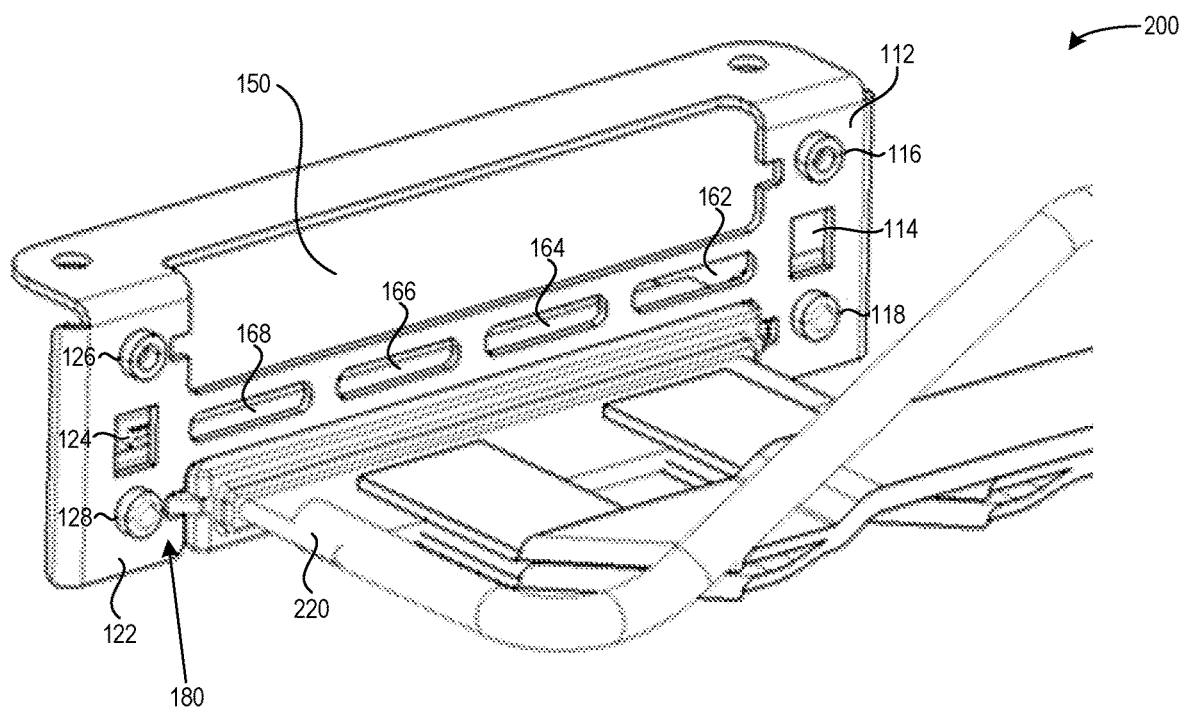
FIG. 2A illustrates a bracket assembly, with a bracket corresponding to the bracket of FIG. 1A and one set of assembled cables, from a rear isometric view, in accordance with an aspect of the present application.

FIG. 2A illustrates a bracket assembly 200, with a bracket corresponding to bracket 100 of FIG. 1A and one set of assembled cables 220, from a rear isometric view, in accordance with an aspect of the present application. In FIG. 2A, bracket assembly 200 is viewed from a back side which depicts back side 180 of bracket 100. Bracket assembly 200 can include a set of cables 220 inserted through fourth opening 152 (not labeled) of bracket 100 and affixed to bracket 100 through second cable connector opening 118 and fourth cable connector opening 128. Bracket assembly 200 also depicts third opening 150.

Figure 2B:
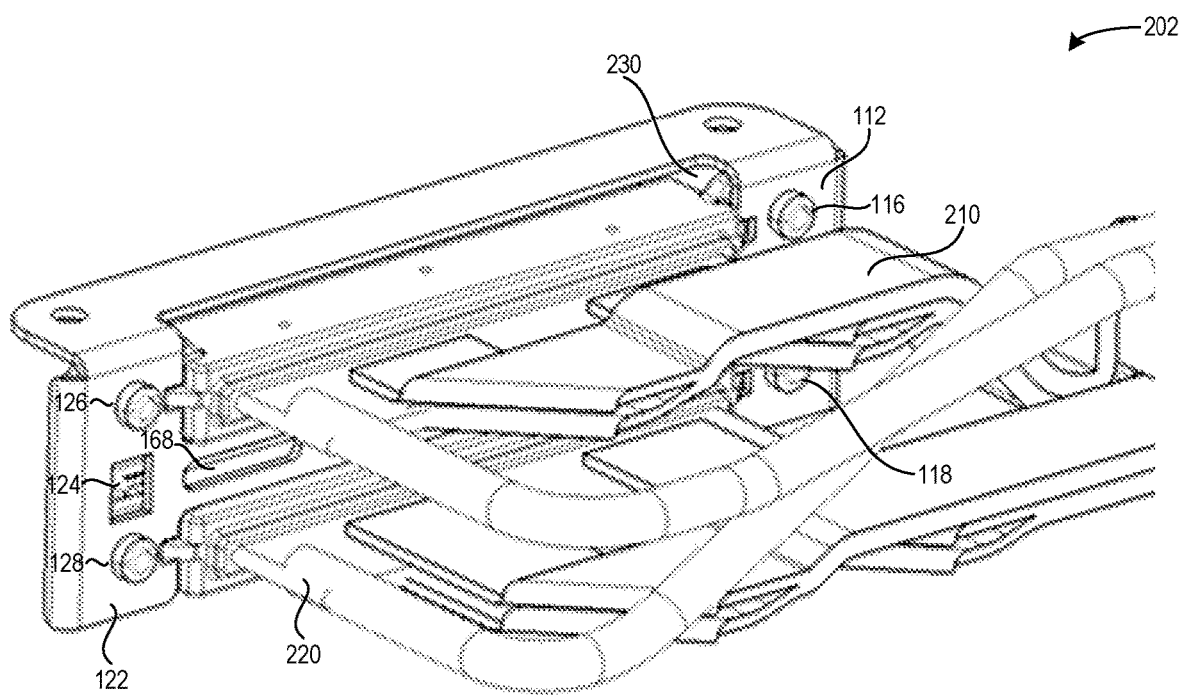
FIG. 2B illustrates a bracket assembly, with a bracket corresponding to the bracket of FIG. 1A and two sets of assembled cables, from a rear isometric view, including a gap for air flow above a first set of assembled cables, in accordance with an aspect of the present application.

FIG. 2B illustrates a bracket assembly 202, with a bracket corresponding to bracket 100 of FIG. 1A and two sets of assembled cables 210 and 220, from a rear isometric view, including a gap 230 for air flow above first set of assembled cables 210, in accordance with an aspect of the present application. Bracket assembly 202 can include: a first set of cables 210 inserted through third opening 150 (not labeled) of bracket 100 and affixed to bracket 100 through first cable connector opening 116 and third cable connector opening 126; and a second set of cables 220 inserted through fourth opening 152 (not labeled) and affixed to bracket 100 through second cable connector opening 118 (partially visible) and fourth cable connector opening 128 (as depicted above in FIG. 2A). When first set of cables 210 is inserted through third opening 150 (not labeled), bracket assembly 202 can include gap 230 between inserted first set of cables 210 and second portion 130 of bracket 100. Bracket assembly 202 can thus allow air to flow through both gap 230 and openings 162-168 and provide cooling for bracket assembly 202 and any components in the same chassis which may require cooling, such as inserted HBAs 610 and 612 depicted below in relation to FIG. 6.

Figure 2C:
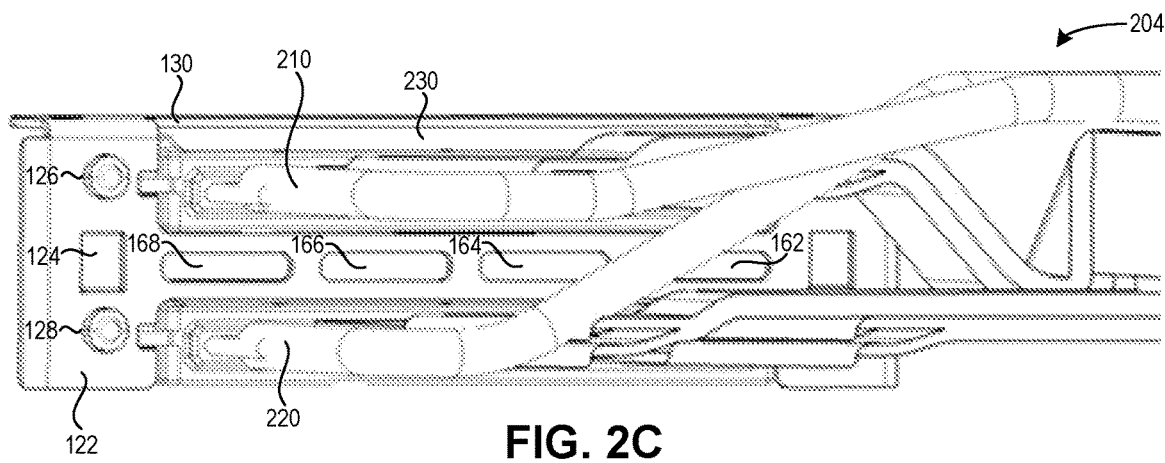
FIG. 2C illustrates a bracket assembly corresponding to the bracket assembly of FIG. 2B, from a rear view, in accordance with an aspect of the present application.

FIG. 2C illustrates a bracket assembly 204 corresponding to bracket assembly 202 of FIG. 2B, from a rear view, in accordance with an aspect of the present application. Bracket assembly 204 indicates both gap 230 and openings 162-168 for air flow above and around sets of cables 210 and 220, which can provide cooling for bracket assembly 204 and components such as cables 210 and 220 and HBAs 610 and 612.

Figure 2D:
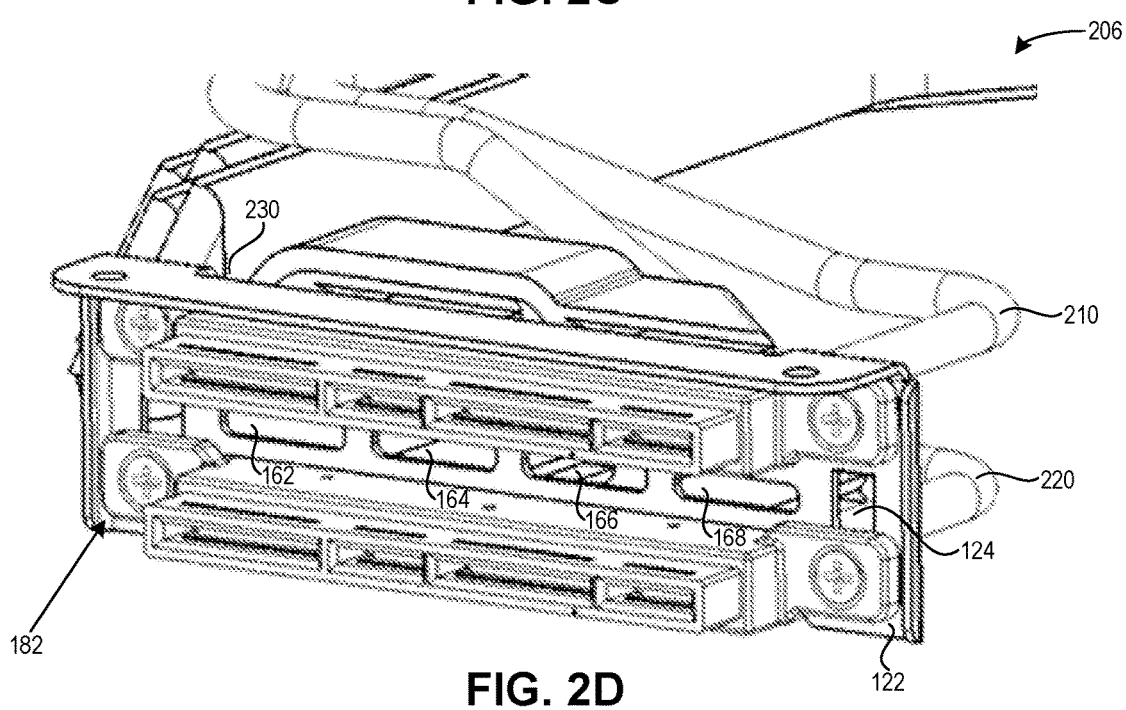
FIG. 2D illustrates a bracket assembly corresponding to the bracket assembly of FIG. 2B, from a front isometric view, in accordance with an aspect of the present application.

FIG. 2D illustrates a bracket assembly 206 corresponding to bracket assembly 202 of FIG. 2B, from a front isometric view, in accordance with an aspect of the present application. Bracket assembly 206 also indicates both gap 230 and opening 162-168 for air flow above and around sets of cables 210 and 220, which can provide cooling for bracket assembly 206 and components such as cables 210 and 220 and HBAs 610 and 612. In FIG. 2D, bracket assembly 206 is viewed from a front side which depicts front side 182 of bracket 100.

Figure 2E:
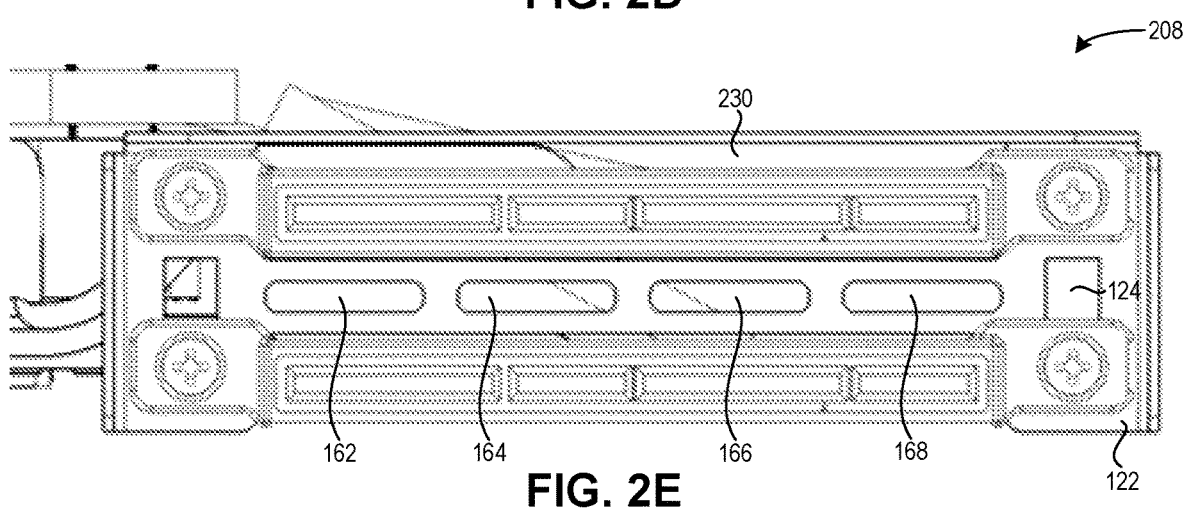
FIG. 2E illustrates a bracket assembly corresponding to the bracket assembly of FIG. 2B, from a front view, in accordance with an aspect of the present application.

FIG. 2E illustrates a bracket assembly 208 corresponding to bracket assembly 202 of FIG. 2B, from a front view, in accordance with an aspect of the present application. Bracket assembly 208 also indicates both gap 230 and openings 162-168 for air flow above and around sets of cables 210 and 220, which can provide cooling for bracket assembly 208 and components such as cables 210 and 220 and HBAs 610 and 612.

Figure 3:
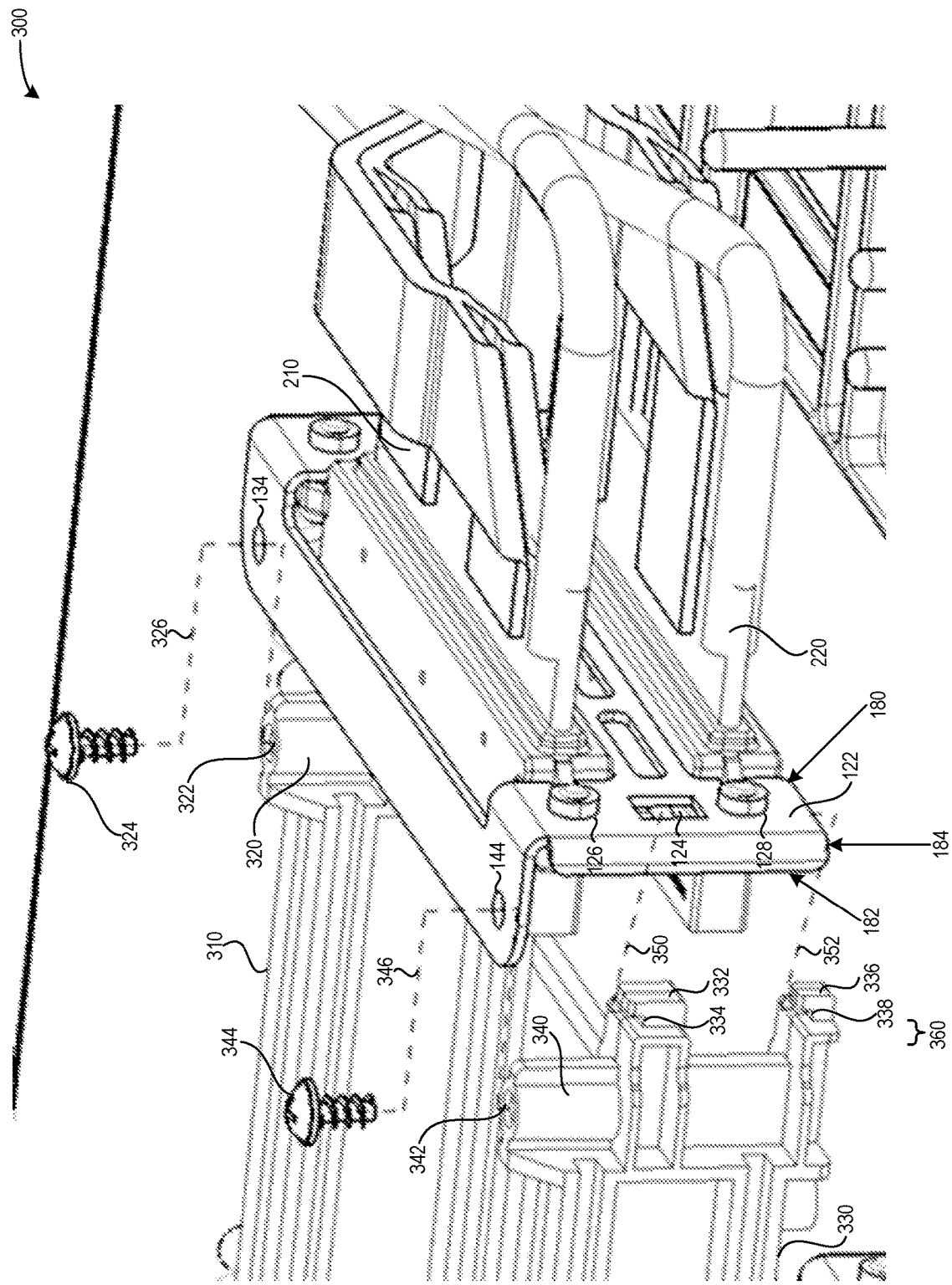
FIG. 3 illustrates a bracket assembly which includes a bracket (as in FIG. 1A) and two sets of assembled cables (as in FIG. 2B), as well as a pair of guide rails, from a rear isometric view and prior to placing the bracket against the guide rails, in accordance with an aspect of the present application.

FIG. 3 illustrates a bracket assembly 300 which includes bracket 100 (as in FIG. 1A) and two sets of assembled cables 210 and 220 (as in FIG. 2B), as well as a pair of guide rails 310 and 330, from a rear isometric view and prior to placing bracket 100 against guide rails 310 and 330, in accordance with an aspect of the present application. The term "end" in reference to the guide rails can refer to the end of the guide rail which faces the bracket, where the end refers to the end of the respective guide rail further away from the front of the chassis and closest to the back of the chassis, as described above.

The pair of guide rails can include: a first rail 310 which includes a first tab (not visible) protruding from a first end (not visible) of first rail 310 at a middle area of first rail 310, wherein the first tab can include a first notch (not visible); and a second rail 330 which includes a second tab 332 protruding from a second end 360 of second rail 330 at a middle area of second rail 330, wherein second tab 332 can include a second notch 334. The first end of first rail 310 and second end 360 of second rail 330 refer to the end of rails 310 and 330 closest to the bracket 100 or the back of the chassis in which bracket assembly 300 resides or is installed. The middle areas of rails 310 and 330 can refer to a same plane which is parallel to second portion 130 of bracket 100 at approximately an area near to a middle region of guide rails 310 and 330 in a vertical direction, e.g., as aligned with second opening 124 of second segment 122 of first portion 110.

First rail 310 can further include a third tab protruding from the first end of first rail 310 below the middle area of first rail 310, wherein the third tab can include a third notch (not shown). Second rail 330 can further include a fourth tab 336 protruding from second end 360 of second rail 330 below the middle area of second rail 330, wherein the fourth tab can include a fourth notch 338.

The first end, first tab, and first notch of first rail 310 are not visible in FIG. 3, but appear in the same location on first rail 310 as, respectively, second end 360, second tab 332, and second notch 334 of rail 330. Similarly, the first end, third tab, and third notch of first rail 310 are not visible in FIG. 3, but appear in the same location on first rail 310 as, respectively, second end 360, fourth tab 336, and fourth notch 338 of second rail 330.

Bracket 100 is to attach to guide rails 310 and 330 when front side 182 of first portion 110 of bracket 100 is placed against the ends of guide rails 310 and 330 such that: the first tab is inserted into first opening 114 (not shown); second tab 332 is inserted into second opening 124 (via a movement indicated with a dashed line 350); a bottom side of first segment 112 touches or rests on a top of the third tab (not shown); and a bottom side 184 of second segment 122 touches or rests on a top of fourth tab 336 (via a movement indicated with a dashed line 352).

Subsequent to the above placement and insertion movements, bracket 100 is further to attach to guide rails 310 and 330 when bracket 100 is slid down such that: first opening 114 rests in the first notch (not shown); second opening 124 rests in second notch 334; the bottom side of first segment 112 rests in the third notch (not shown); and bottom side 184 of second segment 122 rests in fourth notch 338. The result of the placing, inserting, and sliding down movements are described below in relation to FIGS. 4A and 4B.

First rail 310 can also include a first post 320 with a first connector receiver 322 indented into first post 320, and second rail 330 can also include a second post 340 with a second connector receiver indented into second post 330. Each connector receiver can be a receptacle or opening into which a connecting component or element can be inserted, screwed, or twisted, e.g., a threaded hole or a threaded insert into which a screw can be inserted, screwed, or twisted.

Subsequent to bracket 100 attaching to guide rails 310 and 330 as described above, bracket 100 is further to attach to guide rails 310 and 330 when a first connecting component 324 is inserted through fifth opening 134 into first connector receiver 322 (indicated by a dashed line 326) and a second connecting component 344 is inserted through sixth opening 144 into connector receiver 342 (indicated by a dashed line 346), such that bracket 100 is locked into a fixed position with guide rails 310 and 330.

Figure 4A:
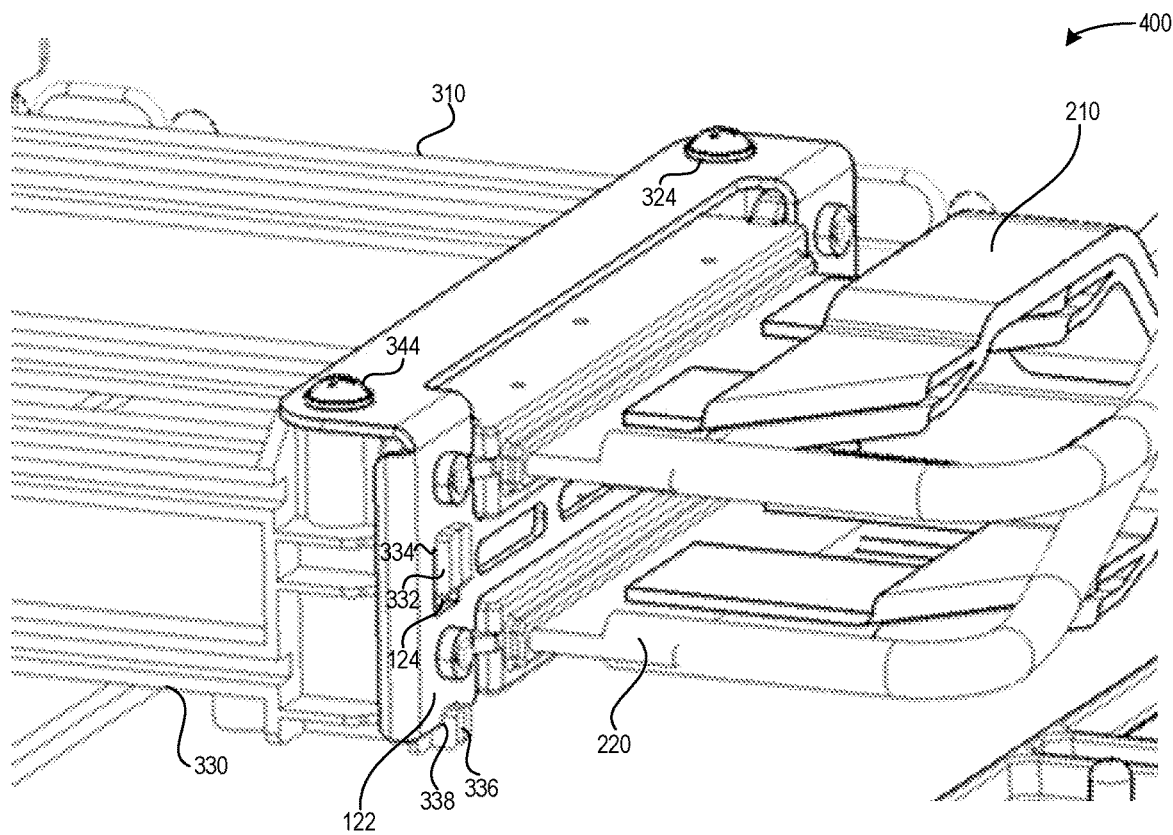
FIG. 4A illustrates a bracket assembly corresponding to the bracket assembly of FIG. 3, from a rear isometric view and subsequent to placing the bracket against the guide rails, in accordance with an aspect of the present application.

FIG. 4A illustrates a bracket assembly 400 corresponding to bracket assembly 300 of FIG. 3, from a rear isometric view and subsequent to placing bracket 100 against guide rails 310 and 330, in accordance with an aspect of the present application. In bracket assembly 400, a first side (front side 182) of first portion 110 has been placed against the ends of guide rails 310 and 330 such that the first tab (not visible) is inserted into first opening 114 (not visible) and second tab 334 is inserted into second opening 124. In addition, bracket 100 is slid down such that: first opening 114 (not visible) rests in the first notch (not visible); second opening 124 rests in second notch 334; first segment 112 (not visible) rests in the third notch (not visible); and second segment 122 rests in fourth notch 338.

Figure 4B:
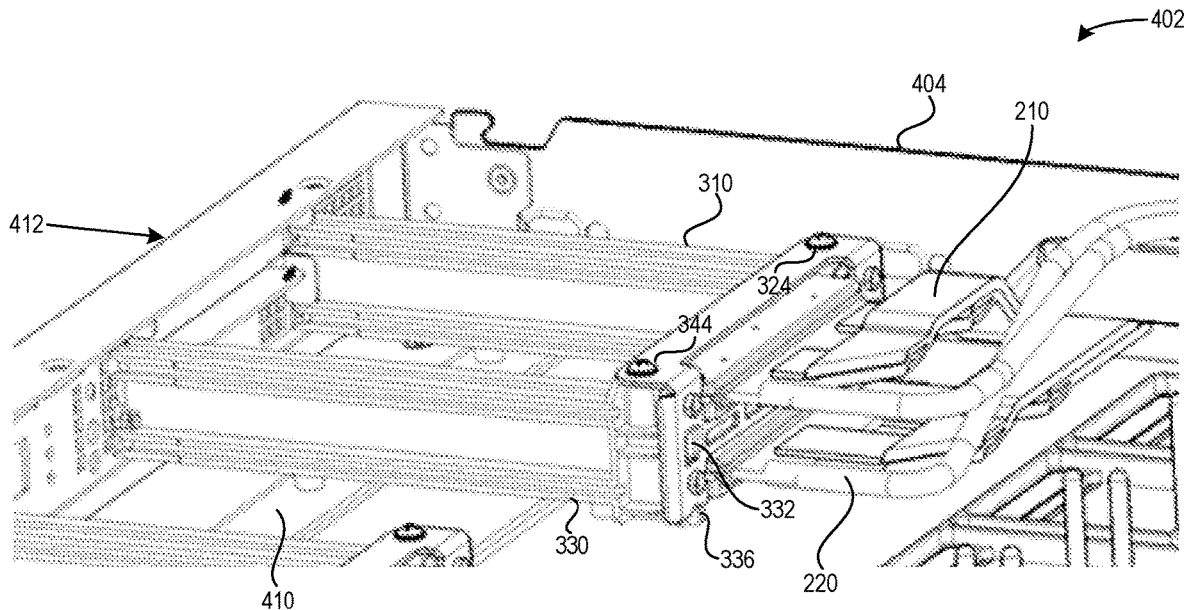
FIG. 4B illustrates a bracket assembly corresponding to the bracket assembly FIG. 4A, from a rear isometric and zoomed-out view, including a chassis in which the bracket assembly resides or is located or installed, in accordance with an aspect of the present application.

FIG. 4B illustrates a bracket assembly 402 corresponding to bracket assembly 400 of FIG. 4A, from a rear isometric and zoomed-out view, including a chassis 404 in which bracket assembly 400 resides or is located or installed, in accordance with an aspect of the present application. Chassis 404 can include: a bottom or bottom side 410, to which the pair of guide rails 310 and 330 may be attached; and a front side 412, into which HBAs and other component cards may be inserted.

The weight of the set of cables 210 may cause the set of cables 210 to sag or bend downwards in the direction of bottom 410 of chassis 404. In some embodiments, the set of cables 210 may be supported by a tray which extends out from the back of the bracket and provides support for the set of cables 210, as described below in relation to FIG. 5A.

Figure 5A:
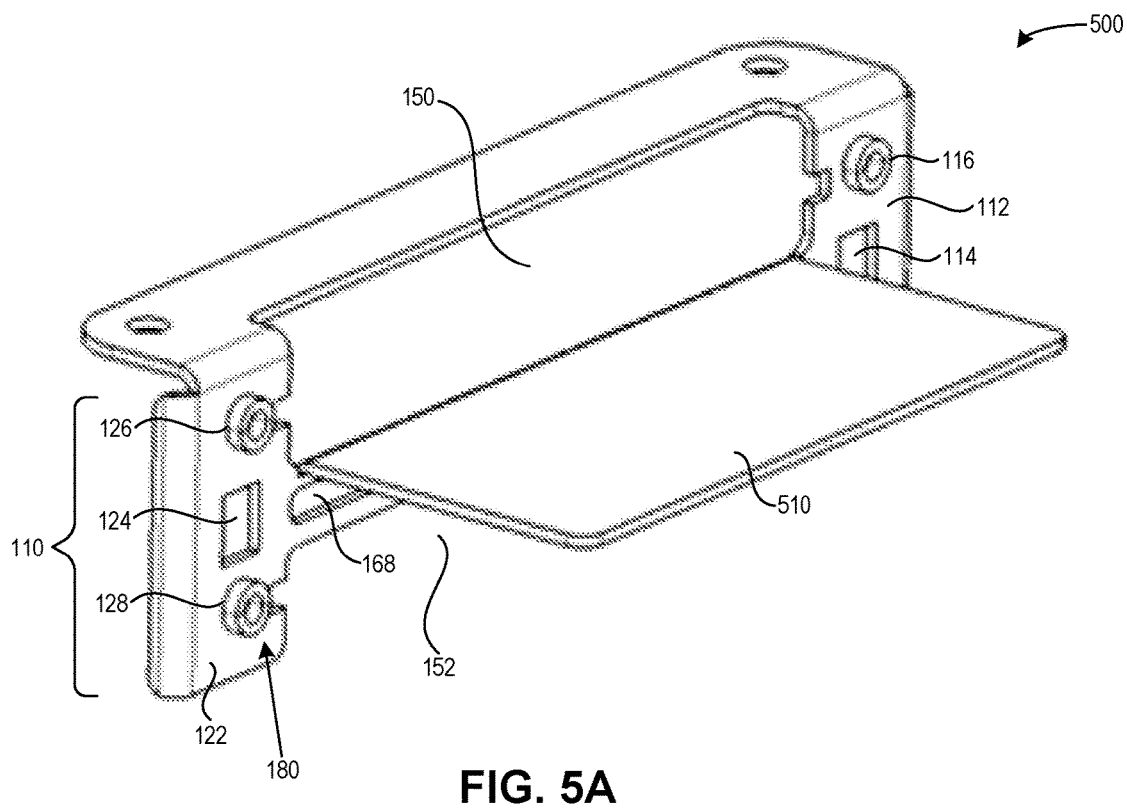
FIG. 5A illustrates a bracket including a tray, from a first rear isometric view and slightly above the bracket, in accordance with an aspect of the present application.

FIG. 5A illustrates a bracket 500, including a tray 510, from a first rear isometric view and slightly above bracket 500, in accordance with an aspect of the present application. In bracket 500, tray 510 can extend from a second side (back side 180) of bracket 500. Tray 510 can support a set of cables (such as 210) inserted through third opening 150, as shown below in relation to FIG. 5C. Tray 510 can be manufactured as a part of the manufacture of bracket 500. Tray 510 can be made of sheet metal which is rigid enough to support the weight of some, all, or any portion of a cable assembly set, as described below in relation to FIG. 5C.

Figure 5B:
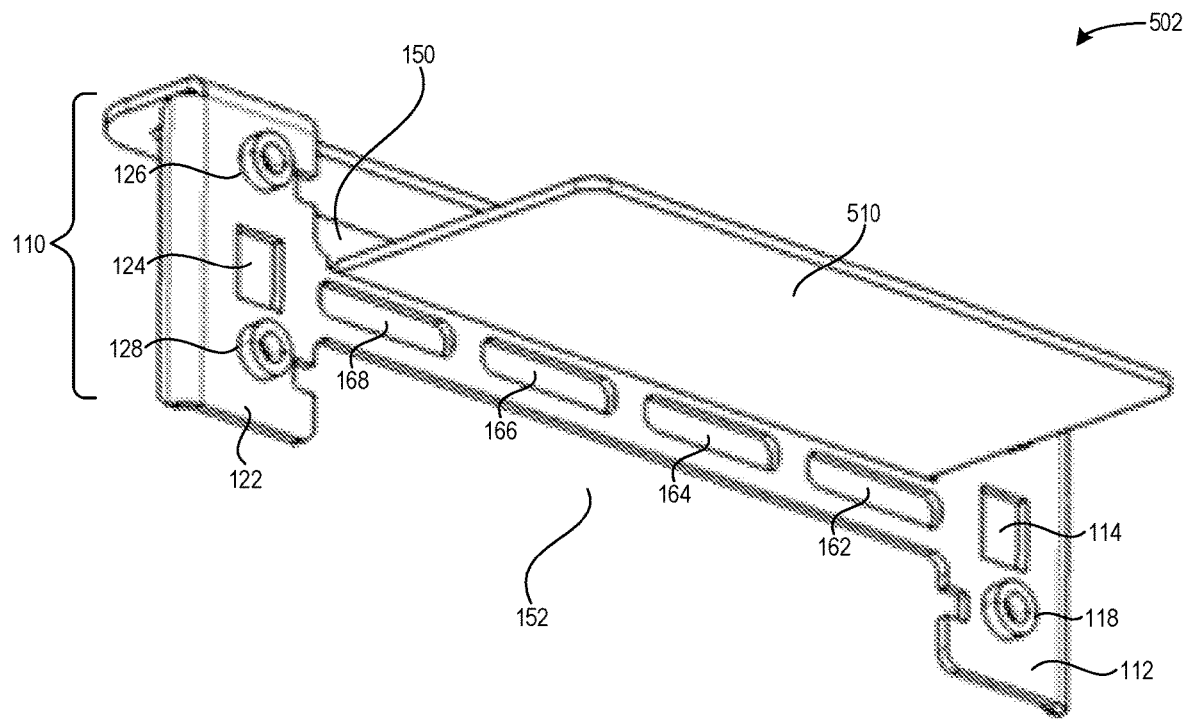
FIG. 5B illustrates a bracket corresponding to the bracket of FIG. 5A, including the tray, from a second rear isometric view and slightly below the bracket, in accordance with an aspect of the present application.

FIG. 5B illustrates a bracket 502 corresponding to bracket 500 of FIG. 5A, including tray 510, from a second rear isometric view and slightly below bracket 502, in accordance with an aspect of the present application. In bracket 502, tray 510 is depicted as protruding out at a perpendicular angle from first portion 110, which allows openings 162-168 to remain unobstructed. Tray 510 in its perpendicular orientation further allows air to flow in an unobstructed manner through openings 162-168 and provide cooling for a bracket assembly and any components associated with the bracket assembly which may require cooling, e.g., inserted HBAs 610 and 612 depicted below in relation to FIG. 6. Tray 510 may protrude out from first portion 110 on back side 180 at a perpendicular or near perpendicular angle (i.e., greater or less than a perpendicular angle by a predetermined amount).

Figure 5C:
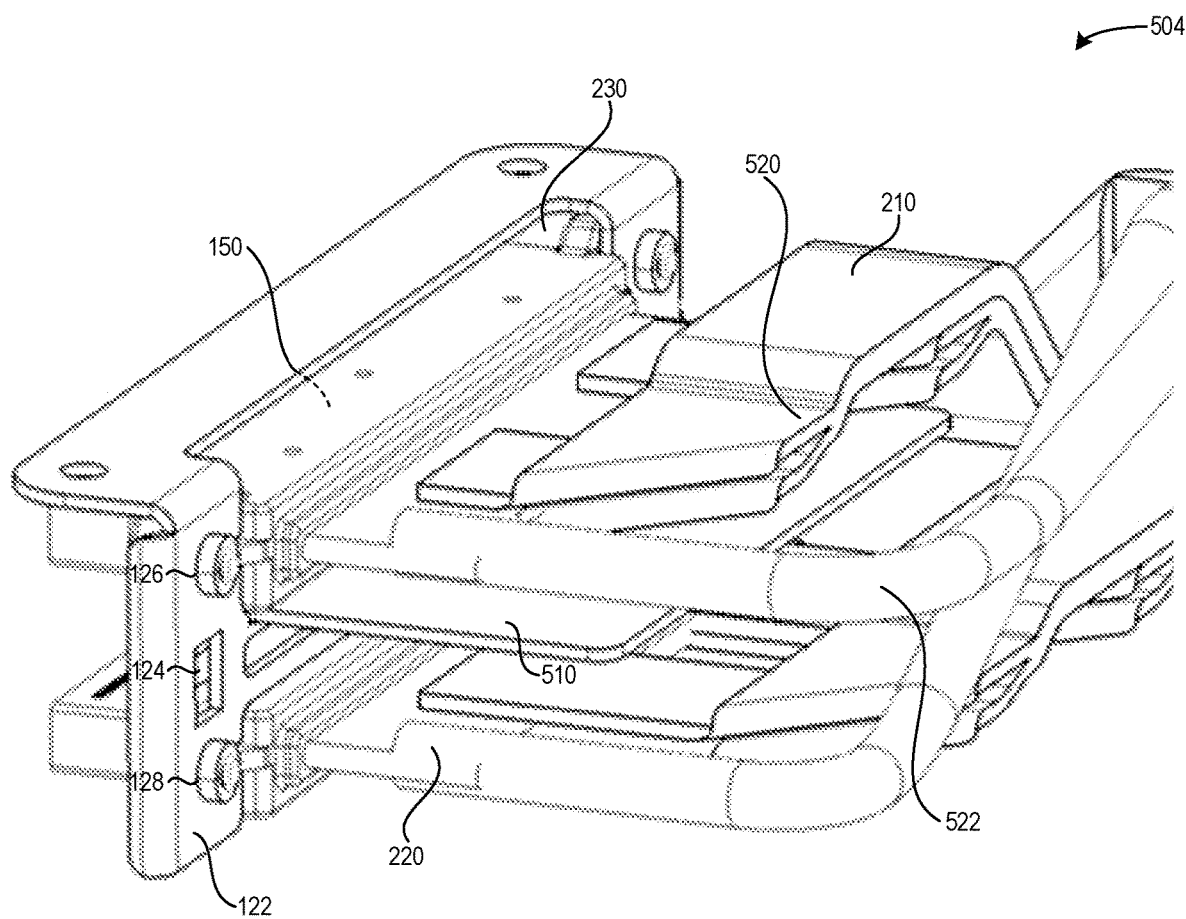
FIG. 5C illustrates a bracket assembly with a bracket corresponding to the brackets of FIGS. 5A and 5B, including the tray, with two sets of assembled cables inserted into the bracket, from a first rear isometric view similar to the view of FIG. 5A, in accordance with an aspect of the present application.

FIG. 5C illustrates a bracket assembly 504 with a bracket corresponding to brackets 500 and 502 of FIGS. 5A and 5B, including tray 510, with two sets of assembled cables 210 and 220 inserted into bracket 504, from a first rear isometric view similar to the view of FIG. 5A, in accordance with an aspect of the present application. Some, all, or any portion of cable assembly set 210 may be in contact with tray 510. Tray 510 can thus support some, all, or any portion of cable assembly set 210 when cable assembly set 210 is inserted through third opening 150 (depicted with a dashed line in FIG. 5C) of bracket 504. A first part 520 of cable assembly set 210 can extend from the second side (back side 180) of bracket 500 by a first distance, and a second part 522 of cable assembly set 210 can extend from the second side of bracket 500 by a second distance, where the first distance is less than the second distance. In some aspects, second part 522 may be a more rigid material than first part 520 and may require less support than first part 520. As a result, tray 510 may extend from the second side of bracket 500 by at least the first (and lesser) distance.

Figure 6:
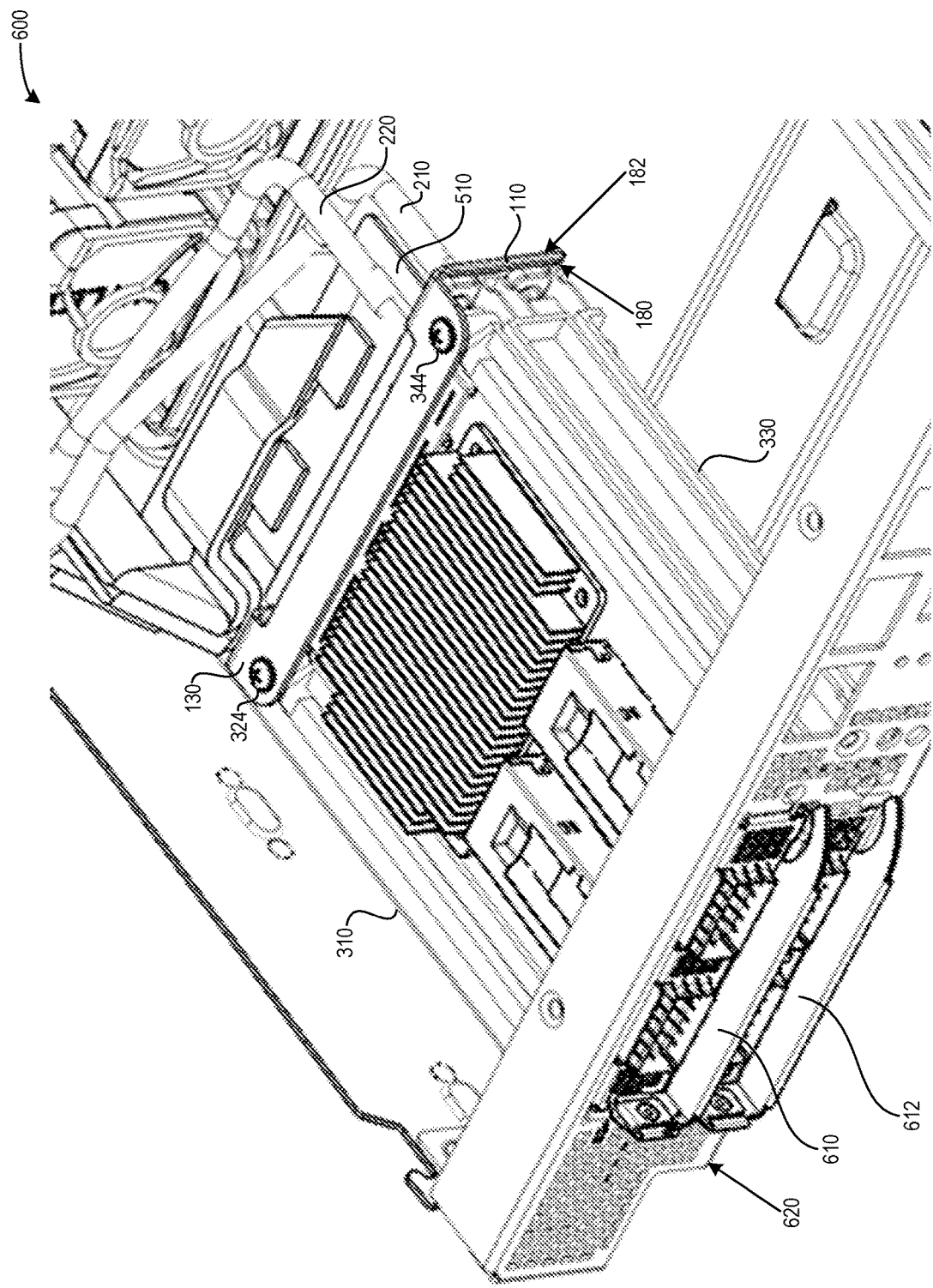
FIG. 6 illustrates an apparatus with a bracket, assembled cables, guide rails, and HBAs, from a front isometric view and slightly below the bracket, in accordance with an aspect of the present application.

FIG. 6 illustrates an apparatus 600 with bracket 500, cable assembly sets 210 and 220, guide rails 310 and 330, and HBAs 610 and 612, from a front isometric view and slightly below bracket 502, in accordance with an aspect of the present application. Apparatus 600 can represent a chassis or an input/output module (IOM). In apparatus 600, bracket 500 is depicted with first portion 110, second portion 130, and tray 510. Front side 180 and back side 182 can indicate the direction or position of bracket 500 and can correspond to the prior Figures. Bracket 500 is connected to cable assembly sets 210 and 220, as described above in relation to FIGS. 2A-2E. Bracket 500 is also mounted or attached to the ends of guide rails 310 and 330 and is affixed or locked into position with guide rails 310 and 330 via connecting components 324 and 344, as described above in relation to FIGS. 3, 4A, and 4B. HBAs 610 and 612 are inserted in apparatus 600 from a front side 620 of apparatus 600.

In some aspects, apparatus/chassis/IOM 600 can include another bracket assembly (not shown), which can include another bracket and another one or two cable assembly sets, as well as another pair of guide rails and another one or two HBAs which can be inserted in apparatus 600 from front side 620 of apparatus 600. This other bracket assembly (not shown) can be positioned or located next to bracket 500, cable sets 210 and 220, guide rails 310 and 330, and HBAs 612 and 612, as depicted in FIG. 6. Thus, apparatus 600 can represent a 2 U IOM which can support three to four stacked HBAs (e.g., 610, 612, and the one or two other HBAs), via the three to four bracket-mounted cable assembly sets (e.g., 210, 220, and the one or two other cable assembly sets). In other aspects, apparatus 600 can include two or more bracket assemblies, where each bracket assembly can support up to two stacked HBAs via a corresponding number of bracket-mounted cable assembly sets, and where each bracket assembly can be positioned next to another bracket assembly.

Aspects of the instant application can include one or more of: bracket 100; bracket assembly 200; bracket assembly 202; bracket assembly 300; guide rail 310; guide rail 330; cable assembly set 210; cable assembly set 220; chassis 404; bracket 500; tray 510; bracket assembly 504; apparatus 600; and HBAs 610 and 612. Aspects of the instant application can also include a method which facilitates connecting a bracket to a pair of rails in the manner described herein.

Figure 7A:
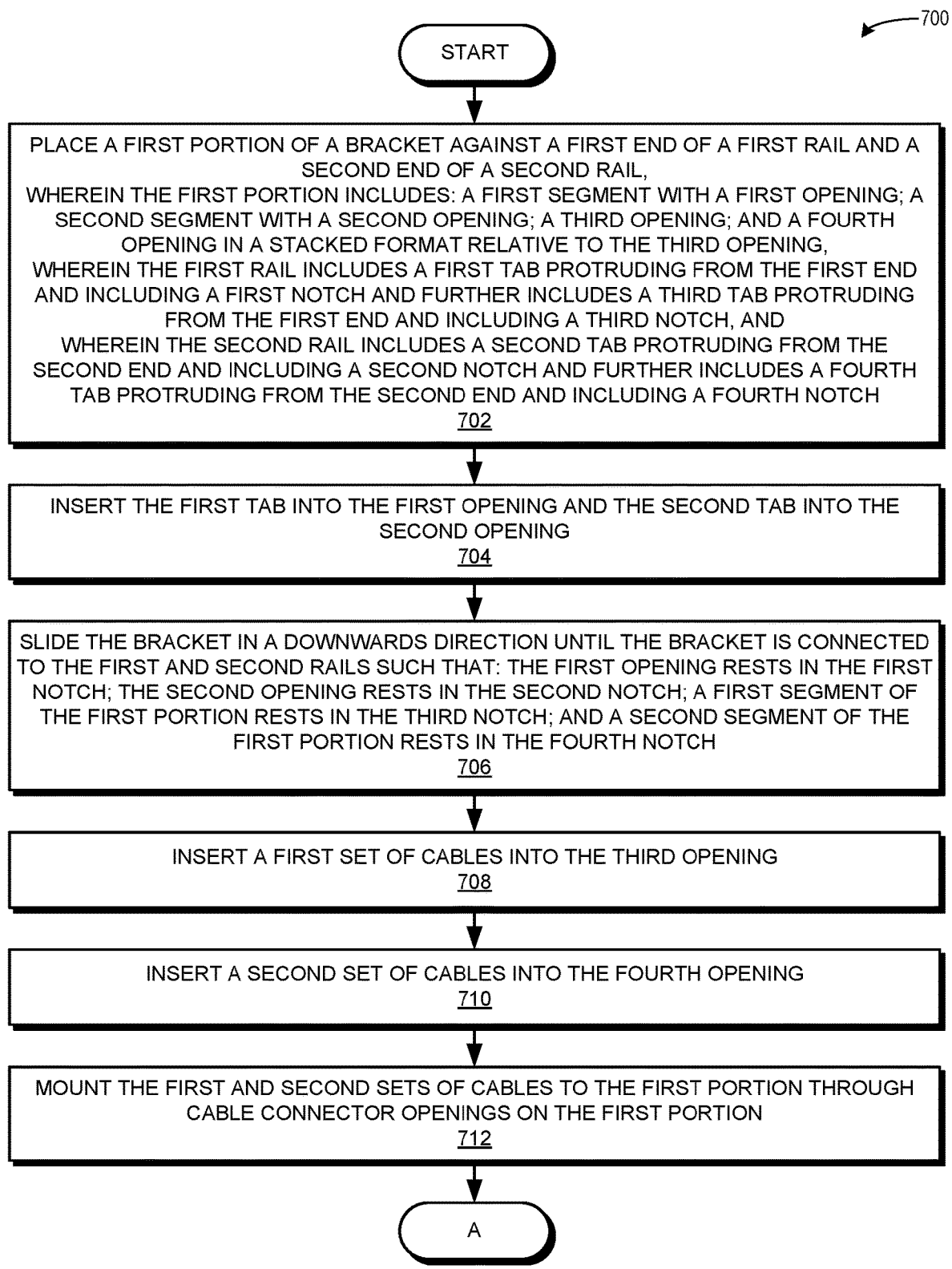
FIG. 7A presents a flowchart illustrating a method which facilitates connecting a bracket to rails, in accordance with an aspect of the present application.

FIG. 7A presents a flowchart 700 illustrating a method which facilitates connecting a bracket to rails, in accordance with an aspect of the present application. During operation, a system (e.g., a user or other entity) places a first portion of a bracket against a first end of a first rail and a second end of a second rail, wherein the first portion includes: a first segment with a first opening; a second segment with a second opening; a third opening; and a fourth opening in a stacked format relative to the third opening, wherein the first rail includes a first tab protruding from the first end and including a first notch and further includes a third tab protruding from the first end and including a third notch, and wherein the second rail includes a second tab protruding from the second end and including a second notch and further includes a fourth tab protruding from the second end and including a fourth notch (operation 702). The system inserts the first tab into the first opening and the second tab into the second opening (operation 704). The system slides the bracket in a downwards direction until the bracket is connected to the first and second rails such that: the first opening rests in the first notch; the second opening rests in the second notch; a first segment of the first portion rests in the third notch; and a second segment of the first portion rests in the fourth notch (operation 706).

The system inserts a first set of cables into the third opening of the first portion (operation 708) and inserts a second set of cables into the fourth opening of the first portion (operation 710). The system mounts the first and second sets of cables to the first portion through cable connector openings on the first portion (operation 712). The operation continues at Label A of FIG. 7B.

Figure 7B:
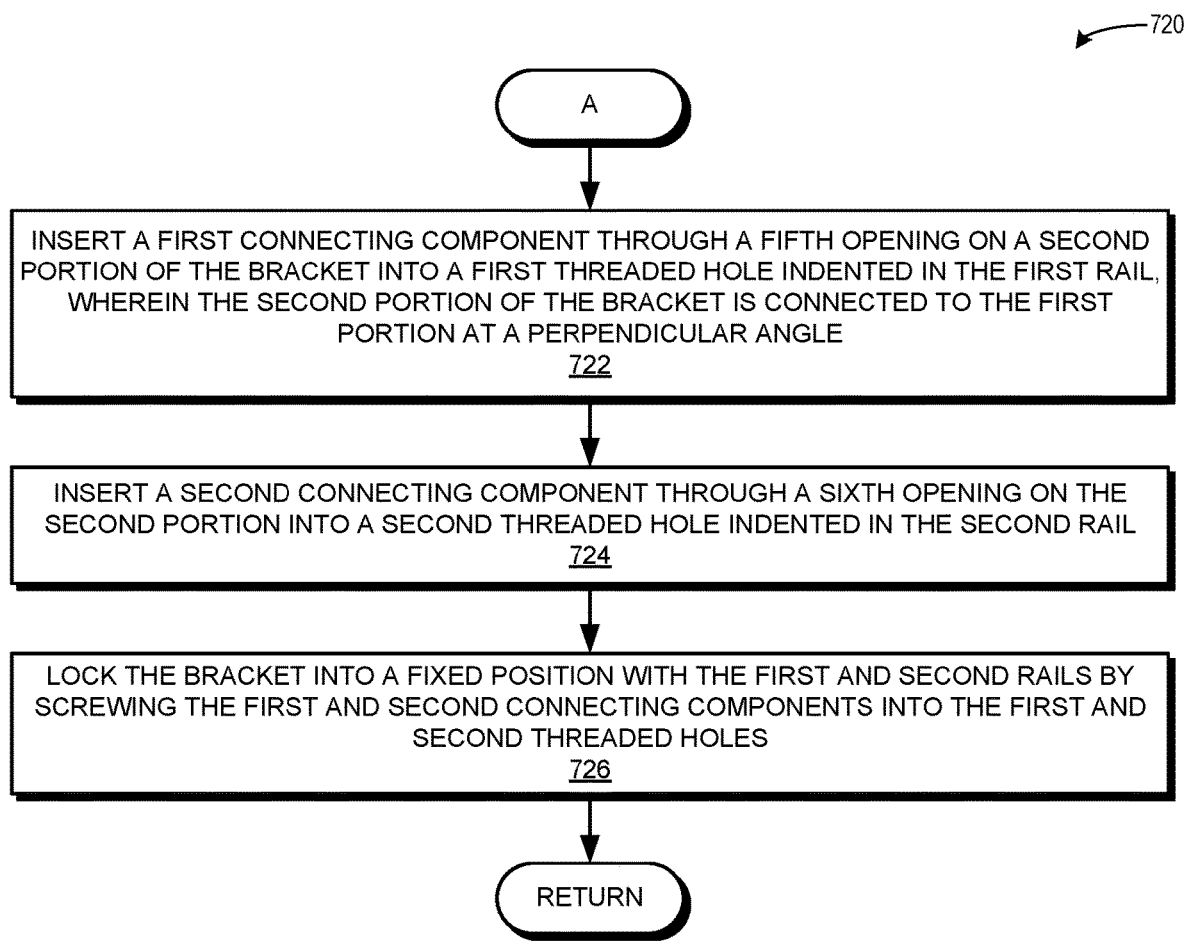
FIG. 7B presents a flowchart illustrating a method which facilitates connecting a bracket to rails, in accordance with an aspect of the present application.

FIG. 7B presents a flowchart 720 illustrating a method which facilitates connecting a bracket to rails, in accordance with an aspect of the present application. The system inserts a first connecting component through a fifth opening on a second portion of the bracket into a first threaded hole indented in the first rail, wherein the second portion of the bracket is connected to the first portion at a perpendicular angle (operation 722). The system inserts a second connecting component through a sixth opening on the second portion into a second threaded hole indented in the second rail (operation 724). The system locks the bracket into a fixed position with the first and second rails by screwing the first and second connecting components into the first and second threaded holes (operation 726), and the operation returns. The operations of FIGS. 7A and 7B can also include inserting HBAs into a front of a chassis in which a bracket assembly (comprising the bracket, rails, and cable sets) resides or is installed.

The operations depicted in FIGS. 7A and 7B may occur in an order different from the order depicted in FIGS. 7A and 7B. For example, operations 702-706 may occur sequentially, while operations 708-712 may generally occur before operations 702-706. Furthermore, 722-726 may only occur after operations 702-706 have occurred, and generally may only occur after operations 708-712 have also occurred.

In general, the disclosed aspects provide a cable bracket for stacked HBAs with bracket-mounted connectors. In one aspect of the present application, a bracket assembly comprises a bracket and a pair of rails. The bracket comprises a first portion which includes a first segment with a first opening and a second segment with a second opening. The pair of rails comprises: a first rail which includes a first tab protruding from a first end of the first rail, wherein the first tab includes a first notch; and a second rail which includes a second tab protruding from a second end of the second rail, wherein the second tab includes a second notch. The bracket is to attach to the pair of rails when: a first side of the first portion is placed against the ends of the rails such that the first tab is inserted into the first opening and the second tab is inserted into the second opening; and the bracket is slid down such that the first opening rests in the first notch and the second opening rests in the second notch.

In a variation on this aspect, the first tab protrudes from the first end at a middle area of the first rail, and the second tab protrudes from the second end at a middle area of the second rail. The first rail further includes a third tab protruding from the first end below the middle area of the first rail, wherein the third tab includes a third notch, and the second rail further includes a fourth tab protruding from the second end below the middle area of the second rail, wherein the fourth tab includes a fourth notch.

In another variation on this aspect, the bracket is further to attach to the pair of rails when the bracket is slid down such that the first segment rests in the third notch and the second segment rests in the fourth notch.

In another variation, the first portion further includes: a third opening into which a first set of cables is inserted; and a fourth opening into which a second set of cables is inserted, wherein the fourth opening is in a stacked format relative to the third opening.

In another variation, the first portion further includes a third segment residing in a middle region of the first portion and abutting the first segment, the second segment, the third opening, and the fourth opening of the first portion. The third segment comprises a plurality of openings, and the bracket is further to allow air to flow through the plurality of openings and provide cooling for the bracket assembly.

In a further variation, the first and second openings reside in a middle region of the first portion. The first segment includes a first cable connector opening and a second cable connector opening arranged in opposite directions from the first opening. The second segment includes a third cable connector opening and a fourth cable connector opening arranged in opposite directions from the second opening.

In a further variation, the bracket is further to attach to the first and second set of cables when: the first set of cables is inserted through the third opening and affixed to the bracket through the first and third cable connector openings; and the second set of cables is inserted through the fourth opening and affixed to the bracket through the second and fourth cable connector openings.

In a further variation, the bracket further comprises a second portion which is connected to the first portion at a perpendicular angle. When the first set of cables is inserted through the third opening, the bracket further comprises a gap between the inserted first set of cables and the second portion. The bracket is further to allow air to flow through the gap and provide cooling for the bracket assembly.

In another variation, the bracket further comprises a tray extending from a second side of the first portion, wherein the tray is to support the first set of cables inserted through the third opening.

In another variation, the bracket further comprises a second portion which is connected to the first portion at a perpendicular angle at: a first area which abuts the first segment of the first portion and a fourth segment of the second portion; and a second area which abuts the second segment of the first portion and a fifth segment of the second portion.

In a further variation, the second portion comprises: a fifth opening on the fourth segment of the second portion; and a sixth opening on the fifth segment of the second portion.

In a further variation, the first rail further comprises a first post with a first connector receiver indented into the first post, and the second rail further comprises a second post with a second connector receiver indented into the second post.

In another variation, the bracket is further to attach to the pair of rails when a first connecting component is inserted through the fifth opening into the first connector receiver and a second connecting component is inserted through the sixth opening into the second connector receiver such that the bracket is locked into a fixed position with the pair of rails.

In one aspect of the present application, an apparatus comprises a bracket, a first rail, a second rail, a first set of cables, and a second set of cables. The bracket comprises a first portion which includes: a first segment with a first opening; a second segment with a second opening; a third opening; and a fourth opening in a stacked format relative to the third opening. The first rail includes a first tab protruding from a first end of the first rail, wherein the first tab includes a first notch. The second rail includes a second tab protruding from a second end of the second rail, wherein the second tab includes a second notch. The first set of cables are inserted through the third opening and connected to the bracket. The second set of cables are inserted through the fourth opening and connected to the bracket. The elements of the apparatus of this aspect can correspond to the components of the bracket assembly described above.

In another aspect of the present application, an apparatus can be a chassis which comprises a bracket, a pair of rails, a pair of assembled cable sets, and a pair of HBAs. The bracket comprises a first portion which includes: a first segment with a first opening; a second segment with a second opening; a third opening; and a fourth opening in a first stacked format relative to the third opening. The first rail includes a first tab protruding from a first end of the first rail, wherein the first tab includes a first notch. The second rail includes a second tab protruding from a second end of the second rail, wherein the second tab includes a second notch. The first set of cables are inserted through the third opening and connected to the bracket. The second set of cables are inserted through the fourth opening and connected to the bracket. The pair of HBAs are to insert into the apparatus in a second stacked format which aligns with the first stacked format. The elements of the apparatus of this aspect can correspond to the components of the bracket assembly described above.

In yet another aspect of the present application, a method can include placing a first portion of a bracket against a first end of a first rail and a second end of a second rail, wherein the first portion includes: a first segment with a first opening; a second segment with a second opening; a third opening; and a fourth opening in a stacked format relative to the third opening. The first rail includes a first tab protruding from the first end and including a first notch and further includes a third tab protruding from the first end and including a third notch. The second rail includes a second tab protruding from the second end and including a second notch and further includes a fourth tab protruding from the second end and including a fourth notch. The method further comprises inserting the first tab into the first opening and the second tab into the second opening. The method further comprises sliding the bracket in a downwards direction until the bracket is connected to the first and second rails such that: the first opening rests in the first notch; the second opening rests in the second notch; a first segment of the first portion rests in the third notch; and a second segment of the first portion rests in the fourth notch.

In a variation on the aspect for the method, the method further comprises inserting a first set of cables into the third opening of the first portion and inserting a second set of cables into the fourth opening of the first portion. The method further comprises mounting the first and second sets of cables to the first portion through cable connector openings on the first portion. A second portion of the bracket is connected to the first portion at a perpendicular angle. Subsequent to sliding the bracket in the downwards direction until the bracket is connected to the first and second rails, the method further comprises: inserting a first connecting component through a fifth opening on the second portion into a first threaded hole indented in the first rail; inserting a second connecting component through a sixth opening on the second portion into a second threaded hole indented in the second rail; and locking the bracket into a fixed position with the first and second rails by screwing the first and second connecting components into the first and second threaded holes.

The foregoing descriptions of aspects have been presented for purposes of illustration and description only. They are not intended to be exhaustive or to limit the aspects described herein to the forms disclosed. Accordingly, many modifications and variations will be apparent to practitioners skilled in the art. Additionally, the above disclosure is not intended to limit the aspects described herein. The scope of the aspects described herein is defined by the appended claims.

What is claimed is:

1. A bracket assembly, comprising:
  a bracket configured to hold one or more electrical connectors of an information processing device, the bracket comprising a first portion which includes:
    a first segment with a first mounting opening;
    a second segment with a second mounting opening; and
    one or more connector openings bounded at least in part by the first and second segments and configured to receive the electrical connectors; and
  a pair of rails configured to be disposed in and attached to a chassis of the information processing device and to receive and support removable component cards installed in the information processing device, the pair of rails comprising:
    a first rail which includes a first tab protruding from a first end of the first rail, wherein the first tab includes a first notch on a top side of the first tab; and
    a second rail which includes a second tab protruding from a second end of the second rail, wherein the second tab includes a second notch on a top side of the first tab;
  wherein the bracket is configured to be attached to the pair of rails by inserting the first and second tabs through the first and second mounting openings, respectively, and then sliding the bracket down such that a rim of the first mounting opening rests in the first notch a rim of the second mounting opening rests in the second notch, and
  wherein in a state of the bracket attached to the pair of rails and the electrical connectors mounted to the bracket, the electrical connectors are positioned to mate with the removable component cards inserted into the pair of rails.

2. The bracket assembly of claim 1,
  wherein the first tab protrudes from the first end at a middle area of the first rail,
  wherein the second tab protrudes from the second end at a middle area of the second rail,
  wherein the first rail further includes a third tab protruding from the first end below the middle area of the first rail, wherein the third tab includes a third notch, and
  wherein the second rail further includes a fourth tab protruding from the second end below the middle area of the second rail, wherein the fourth tab includes a fourth notch.

3. The bracket assembly of claim 2,
  wherein the third notch and fourth notch are configured such that, as the bracket is slid down during attachment of the bracket to the pair of rails, a bottom edge of the first segment enters and comes to rest in the third notch and a bottom edge of the second segment enters and to rest in the fourth notch.

4. The bracket assembly of claim 1, wherein the first portion further includes:
a first connector opening of the connector openings configured to receive a first electrical connector of the electrical connectors; and
a second connector opening of the connector openings configured to receive a second electrical connector of the electrical connectors,
wherein the first and second connector openings are stacked relative to one another.

5. The bracket assembly of claim 4, wherein the first portion further includes:
a third segment extending between the first and second segments and disposed between the first and second connector openings,
wherein the third segment comprises a plurality of openings, and
wherein the bracket is further to allow air to flow through the plurality of openings and provide cooling for the bracket assembly.

6. The bracket assembly of claim 4,
wherein the first segment includes a first connector attachment element adjacent the first connector opening and a second connector attachment element arranged adjacent to the second connector opening, and
wherein the second segment includes a cable connector attachment element adjacent the first connector opening and a fourth connector attachment element arranged adjacent the second connector opening.

7. The bracket assembly of claim 6,
wherein the bracket is configured to have the electrical connectors mounted thereto by:
insertion of the first and second electrical connectors through the first and second connector openings, respectively;
engagement of a first pair of connector fasteners with the first electrical connector and the first and third connector attachment elements; and
engagement of a second pair of connector fasteners with the second electrical connector and the second and fourth connector attachment elements.

8. The bracket assembly of claim 7,
wherein the bracket further comprises a second portion which is connected to the first portion at a perpendicular angle,
wherein when the first electrical connector is inserted through the first electrical connector opening, the bracket further comprises a gap between the inserted first electrical connector and the second portion, and
wherein the bracket is further to allow air to flow through the gap and provide cooling for the bracket assembly.

9. The bracket assembly of claim 7,
wherein the bracket further comprises a tray extending from a second side of the first portion, and
wherein the tray is to support the first set of cables inserted through the third opening.

10. The bracket assembly of claim 1,
wherein the bracket further comprises a second portion which is connected to the first portion at a perpendicular angle and configured to, in the attached state of the bracket to the pair of rails, extend over a portion of the pair of rails.

11. The bracket assembly of claim 10,
wherein the first rails comprises a first post with a first fastener receiver in a top surface thereof, and the second rail comprises a second post with a second fastener receiver in a top surface thereof;
wherein the second portion comprises a first fastener opening and a second fastener opening,
wherein, in the attached state of the bracket to the pair of rails: the second portion extends over and abuts the top surfaces of the first and second posts, a first bracket fastener is engaged with the first fastener opening and the first fastener receiver, and a second bracket fastener is engaged with the second fastener opening and the second fastener receiver.

12. The bracket assembly of claim 11,
wherein the bracket and the pair of rails are configured such that, during attachment of the bracket to the pair of rails, sliding down the bracket such that the rim of the first mounting opening rests in the first notch the rim of the second mounting opening rests in the second notch aligns the first fastener opening with the first fastener receiver and aligns the second fastener opening with the second fastener.

13. An apparatus, comprising:
a chassis;
a pair of rails disposed in and attached to the chassis and configured to receive and support removable component cards, the pair of rails comprising:
a first rail with a first tab protruding from a first end of the first rail, wherein the first tab includes a first notch; and
a second rail which includes a second tab protruding from a second end of the second rail, wherein the second tab includes a second notch;
a bracket attached to the pair of rails, the bracket comprising a first portion which includes:
a first segment with a first mounting opening, the first tab protruding through the first mounting opening with a rim of the first mounting opening resting in the first notch;
a second segment with a second mounting opening, the second tab protruding through the second mounting opening with a rim of the second mounting opening resting in the second notch, wherein the bracket is attached to the pair of rails at least in part by engagement of the bracket with the first and second notches;
a first connector opening; and
a second connector opening in a stacked format relative to the first connector opening;
a first electrical connector connected to a first set of cables, the first electrical connector extending through the first connector opening and being connected to the bracket and positioned to mate with a first component card inserted into the pair of rails; and
a second electrical connector connected to a second set of cables the first electrical connector extending through the second connector opening and being connected to the bracket and positioned to mate with a second component card inserted into the pair of rails.

14. The apparatus of claim 13,
wherein the first tab protrudes from a first end of the first rail at a middle area of the first rail,
wherein the second tab protrudes from a second end of the second rail at a middle area of the second rail,
wherein the first rail further includes a third tab protruding from the first end below the middle area of the first rail, wherein the third tab includes a third notch,
wherein the second rail further includes a fourth tab protruding from the second end below the middle area of the second rail, wherein the fourth tab includes a fourth notch, and wherein a bottom edge of the first segment rests in the third notch and a bottom edge of the second segment rests in the fourth notch such that the bracket is attached to the pair of rails at least in part by engagement of the bracket with the third notch and the fourth notch.

15. The apparatus of claim 13,
wherein the first portion further includes a third segment residing in a middle region of the first portion and abutting the first segment, the second segment, the first connector opening, and the second connector opening of the first portion,
wherein the third segment comprises a plurality of openings, and
wherein the bracket is further to allow air to flow through the plurality of openings and provide cooling for the apparatus.

16. The apparatus of claim 13,
wherein the first electrical connector is connected to the bracket through a set of connector fasteners engaged with a set of connector attachment elements arranged around the first connector opening; and
wherein the second electrical connector is connected to the bracket through a set of connector fasteners engaged with a set of connector attachment elements arranged around the second connector opening.

17. A method, comprising:
providing the bracket assembly of claim 1;
placing the first portion of the bracket against the first end of the first rail and the second end of the second rail and inserting the first and second tabs through the first and second mounting openings,
  wherein the first rail includes a third tab protruding from the first end and including a third notch, and
  wherein the second rail includes a fourth tab protruding from the first end and including a fourth notch;
sliding the bracket in a downwards direction until the rim of the first opening rests in the first notch; the rim of the second opening rests in the second notch; a bottom edge of the first segment of the first portion rests in the third notch; and a bottom edge of the second segment of the first portion rests in the fourth notch.

18. The method of claim 17, further comprising:
inserting a first electrical connector into a first connector opening of the connector openings;
inserting a second electrical connector into a second connector opening of the connector openings;
affixing the first and second electrical connectors to the first portion by engaging connector fasteners with connector fastener attachment elements of the first portion; and
subsequent to sliding the bracket in the downwards direction locking the bracket into a fixed position relative to the first and second rails by:
  inserting a first bracket fastener through a first fastener opening in a second portion of the bracket and into a first fastener receiver in the first rail, the second portion of the bracket being connected perpendicularly to the first portion and extending over a portion of the pair of rails; and
  inserting a second bracket fastener through a second fastener opening in the second portion and into a second fastener receiver in the second rail.

19. The bracket assembly of claim 1, wherein the removable component cards which the pair of rails is configured to receive include open-compute-project (OCP) host-bus-adapters (HBAs), and the electrical connectors which the bracket is configured to hold include OCP connectors configured to mate with the OCP HBAs.

20. The apparatus of claim 13, wherein the removable component cards which the pair of rails is configured to receive include open-compute-project (OCP) host-bus-adapters (HBAs), and the electrical connectors which the bracket is configured to hold include OCP connectors configured to mate with the OCP HBAs.

\* \* \* \* \*